United States Patent
Agarwal et al.

(10) Patent No.: US 10,482,200 B2
(45) Date of Patent: Nov. 19, 2019

(54) MODELING RANDOM DOPANT FLUCTUATIONS IN SEMICONDUCTOR DEVICES

(71) Applicant: GLOBALFOUNDRIES INC., Grand Cayman (KY)

(72) Inventors: Samarth Agarwal, Bangalore (IN); Abhisek Dixit, Kanpur (IN); Jeffrey B. Johnson, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1150 days.

(21) Appl. No.: 14/146,114

(22) Filed: Jan. 2, 2014

(65) Prior Publication Data

US 2015/0186575 A1    Jul. 2, 2015

(51) Int. Cl.
     *G06F 17/50*    (2006.01)
(52) U.S. Cl.
     CPC .................. *G06F 17/5018* (2013.01)
(58) Field of Classification Search
     CPC .................................................. G06F 17/5036
     USPC .................................................. 703/2
     See application file for complete search history.

(56) References Cited

U.S. PATENT DOCUMENTS

| | | | |
|---|---|---|---|
| 6,403,454 B1 * | 6/2002 | Citrin et al. | H01L 21/02381 257/E21.093 |
| 7,353,473 B2 | 4/2008 | Pino et al. | |
| 7,538,873 B2 | 5/2009 | Zechner | |
| 7,756,687 B2 | 7/2010 | Hwang et al. | |
| 8,214,169 B2 | 7/2012 | Bhavnagarwala et al. | |
| 8,407,656 B2 | 3/2013 | Hook et al. | |
| 2009/0164155 A1 | 6/2009 | Agarwal et al. | |

OTHER PUBLICATIONS

"Investigation of realistic dopant fluctuation induced device characteristics variation for sub-100 nm CMOS by using atomistic 3D process/device simulator" Ezaki, T.; Ikezawa, T.; Hane, M. Electron Devices Meeting, 2002. IEDM '02. International; Publication Year: 2002, pp. 311-314 Digital Object Identifier: 10.1109/IEDM.2002.1175841.

(Continued)

*Primary Examiner* — Saif A Alhija
(74) *Attorney, Agent, or Firm* — Michael LeStrange; Hoffman Warnick LLC

(57) ABSTRACT

In one embodiment, the invention comprises: defining a first volume in a layer of a semiconductor device; calculating a probability of finding at least one dopant atom in the first volume, based on a dopant distribution of the layer; in the case that the calculated probability is equal to or greater than a pre-determined threshold, defining at least one additional volume in the layer substantially equal to the first volume; and in the case that the calculated probability is less than the pre-determined threshold: aggregating the first volume with a second volume adjacent the first volume, the second volume being substantially equal to the first volume; and recalculating a probability of finding at least one dopant atom in the aggregated first and second volumes, based on the dopant distribution of the layer.

18 Claims, 6 Drawing Sheets

(56) References Cited

OTHER PUBLICATIONS

"Discrete Dopant Fluctuations in 20-nm/15-nm-Gate Planar CMOS" Yiming Li; Shao-Ming Yu; Jiumm-Ren Hwang; Fu-Liang Yang Electron Devices, IEEE Transactions on vol. 55, Issue 6, Publication Year: 2008, pp. 1449-1455 Digital Object Identifier: 10.1109/TED.2008.921991.

"Modeling statistical distribution of random telegraph noise magnitude" Sonoda, K.; Tanizawa, M.; Ishikawa, K.; Inoue, Y. Simulation of Semiconductor Processes and Devices (SISPAD), 2011 International Conference on Digital Object Identifier: 10.1109/SISPAD.2011.6035039 Publication Year: 2011, pp. 19-22.

Stolk, et al., "Device Modeling of Statistical Dopant Fluctuations in MOS Transistors," 1997, pp. 153-156, IEEE.

Stolk et al., "Modeling Statistical Dopant Fluctuations in MOS Transistors," 1998, pp. 1960-1971, IEEE Transactions on Electron Devices, vol. 45, No. 9.

\* cited by examiner

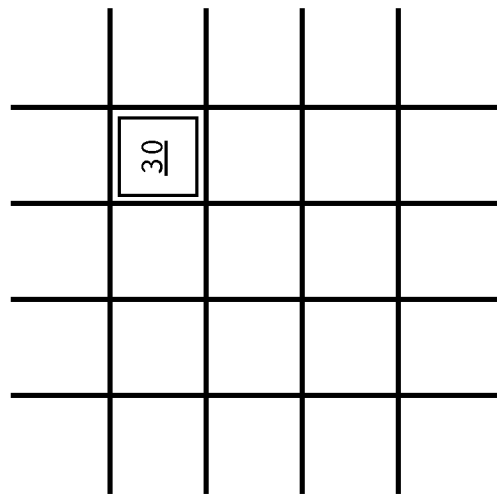
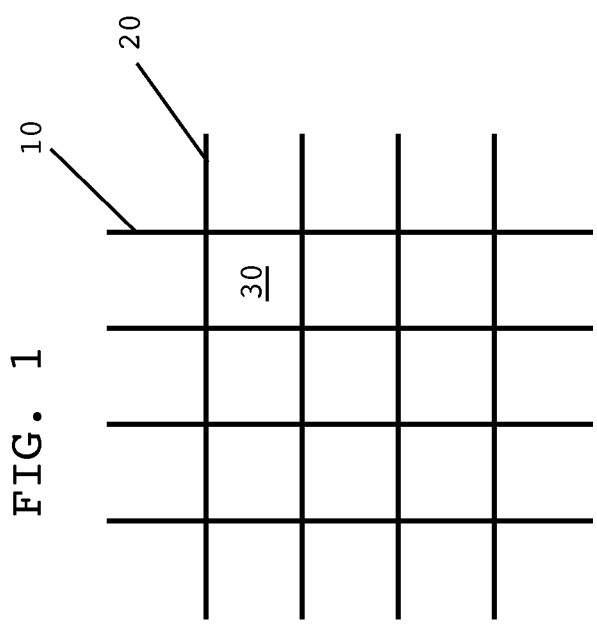

MODELING RANDOM DOPANT FLUCTUATIONS IN SEMICONDUCTOR DEVICES

BACKGROUND

Embodiments of the invention relate generally to semiconductor devices and, more particularly, to the modeling of random dopant fluctuations (RDFs) in semiconductor devices.

The scaling of semiconductor devices, including complimentary metal-oxide-semiconductor (CMOS) devices, makes the electrical performance of a device more strongly dependent upon fluctuations in dopant distribution. In addition, lightly doped semiconductor device layers are inherently more susceptible to fluctuations in dopant distribution than are more heavily doped layers. For example, FinFETs benefit from lightly doped channels having dopant concentrations of around $1\times10^{15}$ atoms per cubic centimeter. Similarly, SRAM and eDRAM devices typically have dopant concentrations between about $1\times10^{16}$ and about $5\times10^{18}$ atoms per cubic centimeter.

Random dopant fluctuations (RDFs) in such lightly doped device layers can dramatically affect device performance, making accurate modeling of RDFs important in quality control. Current RDF modeling techniques are only useful where dopant concentrations are about $5\times10^{17}$ atoms per cubic centimeter or greater.

Poisson distribution statistics allow for discrete probabilistic counting of dopants if the average likelihood of finding a dopant atom is known. However, at low doping concentrations, the average likelihood is also low and the resulting probabilistic counting does not accurately model the actual doping distribution. In other words, a relatively large volume with a low dopant concentration results in a low probability of finding a dopant atom at any particular point within the volume, resulting in a model that artificially underestimates the dopant concentration and/or does not accurately model dopant distribution.

SUMMARY

A first embodiment of the invention provides a method of modeling random dopant fluctuations (RDF) in a semiconductor device, the method comprising: defining a first volume in a layer of a semiconductor device; calculating a probability of finding at least one dopant atom in the first volume, based on a dopant distribution of the layer; in the case that the calculated probability is equal to or greater than a pre-determined threshold, defining at least one additional volume in the layer substantially equal to the first volume; and in the case that the calculated probability is less than the pre-determined threshold: aggregating the first volume with a second volume adjacent the first volume, the second volume being substantially equal to the first volume; and recalculating a probability of finding at least one dopant atom in the aggregated first and second volumes, based on the dopant distribution of the layer.

A second embodiment of the invention provides a computer program product for modeling random dopant fluctuations (RDF) in a semiconductor device, the computer program product comprising a computer-readable storage medium having program code embodied therewith, the program code being executable by a processor of a computing device to perform a method comprising: defining a first volume in a layer of a semiconductor device; calculating a probability of finding at least one dopant atom in the first volume, based on a dopant distribution of the layer; in the case that the calculated probability is equal to or greater than a pre-determined threshold, defining at least one additional volume in the layer substantially equal to the first volume; and in the case that the calculated probability is less than the pre-determined threshold: aggregating the first volume with a second volume adjacent the first volume, the second volume being substantially equal to the first volume; and recalculating a probability of finding at least one dopant atom in the aggregated first and second volumes, based on the dopant distribution of the layer.

BRIEF DESCRIPTION OF THE SEVERAL VEWS OF THE DRAWINGS

These and other features of this invention will be more readily understood from the following detailed description of the various aspects of the invention taken in conjunction with the accompanying drawings that depict various embodiments of the invention, in which:

FIGS. 1-8 show schematic views of meshes and the selection of nodes of a layer of a semiconductor device according to various embodiments of the invention.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION

Figure 4:
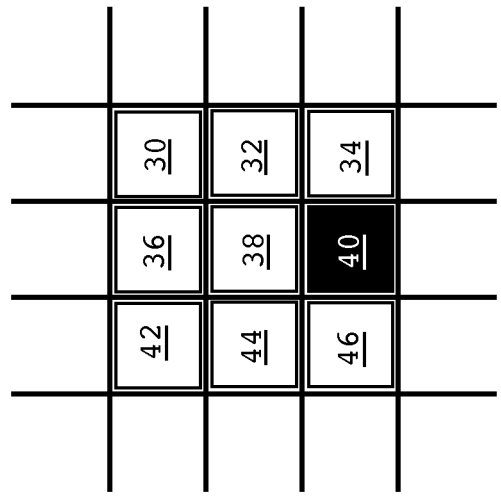

Turning now to the drawings, FIG. 1 shows a mesh comprising a plurality of vertical lines 10 and horizontal lines 20. Such meshes may be referred to as finite element meshes and are commonly employed in known RDF modeling techniques, wherein a mesh is overlaid atop a model of a layer of a semiconductor device, the mesh providing a division of the layer into smaller areas or volumes. It will be understood by one skilled in the art that, in referring to the lines making up a mesh, the terms "vertical" and "horizontal" are used merely for the sake of illustration and to designate the orientations of the lines relative to each other—i.e., substantially perpendicular to each other—rather than absolute vertical or horizontal orientations.

In any case, node 30 may be defined as an area between two vertical lines of the mesh where these two vertical lines intersect two horizontal lines. While the vertical lines 10 and horizontal lines 20 are shown intersecting to form substantially square nodes, other shapes for such nodes are possible and within the scope of the invention.

A first volume may be defined for node 30, the first volume being based on the two-dimensional area of node 30 taken to a particular depth of the semiconductor layer to be modeled. Once a volume for node 30 is defined, a probability of finding at least one dopant atom within the first volume may be calculated based on a known dopant concentration or distribution for the semiconductor layer and/or a known average probability of finding a dopant atom within a volume substantially equal to the first volume.

As used herein, a dopant concentration is meant to reflect an overall concentration of a dopant within a particular volume. This may be equivalent to a dopant distribution, where the concentration is substantially uniform through the volume. In other cases, any number of volumes of a particular size may have the same dopant concentration but different dopant distributions where, for example, the concentration is known to vary within each volume.

For example, where a semiconductor layer is known or believed to have a consistent dopant concentration of $1\times10^{15}$ atoms per cubic centimeter throughout the layer, it is a simple matter to calculate a probability of finding at least one dopant atom within the defined first volume of node 30, as well as an average probability of finding a dopant atom within such a volume.

However, because nodes defined by a mesh typically have a very small area and a correspondingly very small volume, in the case that the dopant concentration or distribution is low, it becomes improbable that a dopant atom will be found within a volume of any given node. For example, since dopant atoms are discrete entities, it is unlikely that any individual volume will include a dopant atom. As a consequence, it will often be the case that most or all volumes within the layer will be calculated to be unlikely to include a dopant atom, a result that is inconsistent with the known dopant concentration or distribution and which underestimates the dopant concentration or distribution within the layer as a whole.

FIG. 2, for example, illustrates that the calculated probability of finding at least one dopant atom within the volume of node 30 indicates that the event is improbable. Typically, a threshold probability will be pre-determined. In other words, for a particular model of RDF in a semiconductor layer, the pre-determined threshold may be, for example, 2.0. In other cases, the threshold may be less than or greater than 2.0.

Figure 3:
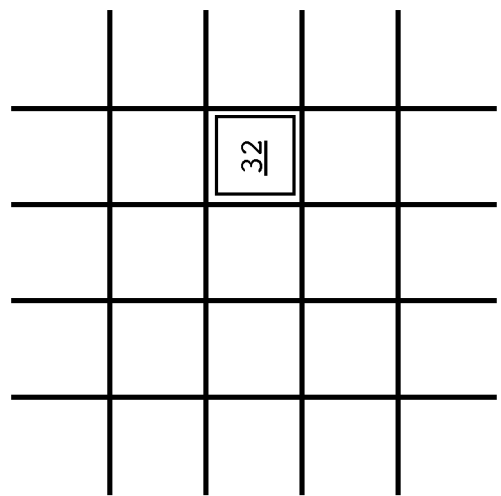

In the example shown in FIG. 2, the calculated probability of finding a dopant atom within the volume of node 30 is less than the pre-determined threshold. In fact, applying Poisson distribution statistics (or any other discrete distribution statistic) in calculating such a probability may result in a finding that the probability of finding a dopant atom within a volume is unlikely for most or all nodes of the mesh. FIG. 3, for example, illustrates that the calculated probability for node 32 also falls below the pre-determined threshold.

FIG. 4 illustrates that for the nine nodes shown within the mesh (in practice, such a mesh may contain tens of thousands of nodes), only one—node 40—was found to have a probability of containing a dopant atom that equaled or exceeded the pre-determined threshold, given a known average probability of finding a dopant atom.

Figure 5:
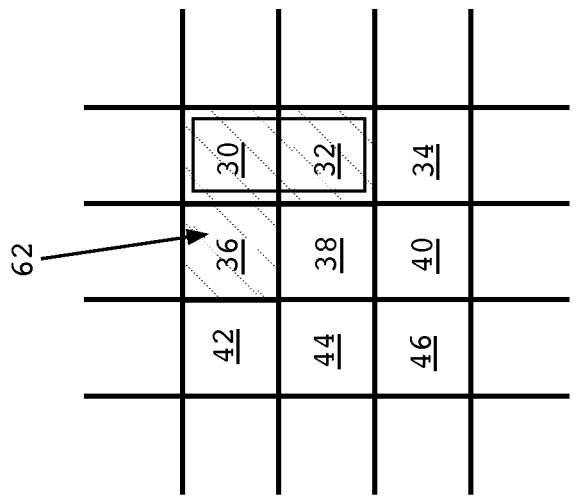

According to embodiments of the invention, where a calculated probability for a first node, e.g., node 30, is less than the pre-determined threshold, the first volume of the first node may be aggregated with a second volume of a second node adjacent the first node, the second volume being substantially equal to the first volume. Following such aggregation, the probability may be recalculated for the aggregated first and second volumes. FIG. 5 illustrates this, where node 30, already calculated to have a probability less than the pre-determined threshold, has been aggregated with adjacent node 32 to form a "supernode" 60.

Figure 6:
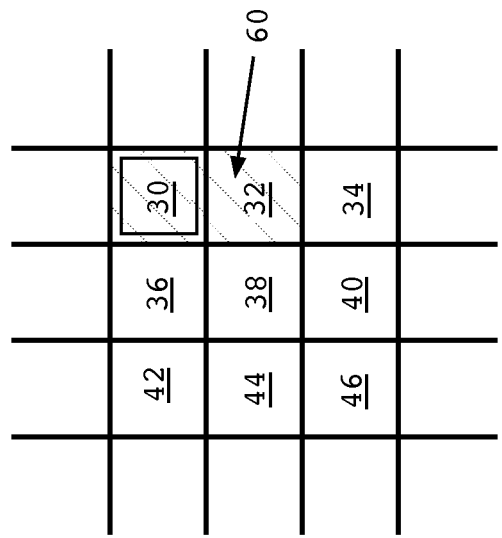

In FIG. 6, it can be seen that the recalculated probability of finding a dopant atom within the aggregated supernode 60 (FIG. 5) was still found to fall below the pre-determined threshold. In such a case, the aggregated volumes of nodes 30 and 32 may be reaggregated with a volume of a node adjacent either of the already-aggregated nodes. In FIG. 6, for example, the volume of node 36 has been reaggregated with the volumes of nodes 30 and 32 to form a second "supernode" 62. Following such reaggreagation, a probability may be recalculated for the reaggregated supernode 62.

Such reaggregation and recalculation may continue iteratively until a calculated probability is found to meet or exceed the pre-determined threshold.

Once a calculated probability of finding at least one dopant atom within a volume—whether a first volume, an aggregated volume, or a reaggregated volume—is greater than the pre-determined threshold, additional volumes may be defined within the layer, each of the additional volumes being substantially equal to the volume for which the calculated probability was equal to or greater than the pre-determined threshold. For example, if the calculated probability for supernode 60 in FIG. 5 met or exceeded the pre-determined threshold, additional volumes may be defined within the layer that are substantially equal to the volume of supernode 60. For example, additional volumes comprising the volumes of nodes 36 and 38, nodes 42 and 44, and nodes 46 and 40, respectively, may be defined within the semiconductor layer.

Figures 7, 8:
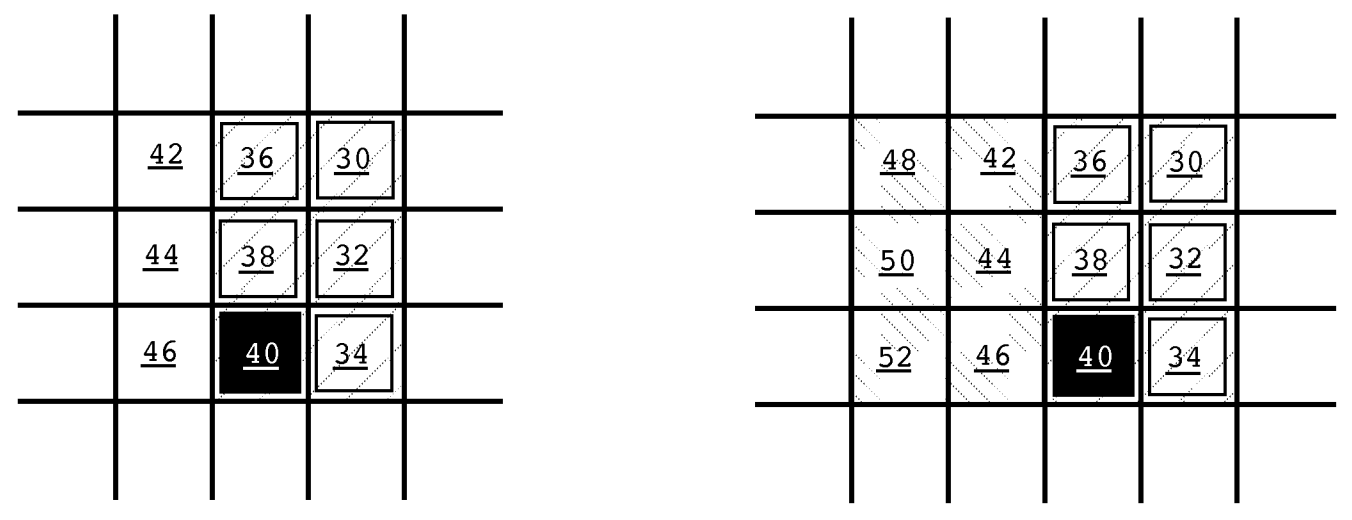

Similarly, FIG. 7 shows a supernode comprising nodes 30, 32, 34, 36, 38, and 40. As noted above, only node 40 was expected to have a probability of finding a dopant atom greater than the pre-determined threshold. In such a case, additional volumes substantially equal to the aggregated volumes of six nodes may be defined within the semiconductor layer. FIG. 8 shows such a case with an expanded view of the mesh, where an additional volume is defined, comprising the volumes of nodes 42, 44, 46, 48, 50, and 52.

In any case, once additional volumes are so defined, a revised dopant concentration or distribution for the layer may be determined and applied to the defined volumes, based on the calculated probability that met or exceeded the pre-determined threshold, using a discrete probability distribution, such as a Poisson distribution. For example, if the recalculated probability is consistent with a dopant concentration or distribution that is half of what was used in making the calculation, a more accurate measure of dopant concentration/distribution and RDF within the layer may be achieved using the revised dopant concentration/distribution.

In some embodiments of the invention, where a dopant distribution is known or suspected to be uneven within the semiconductor layer, the first volume may be a volume of a node expected to have a lowest dopant concentration. In such an embodiment, a second volume may be a volume of a node expected to have a dopant concentration greater than that of the first volume.

Figure 9:
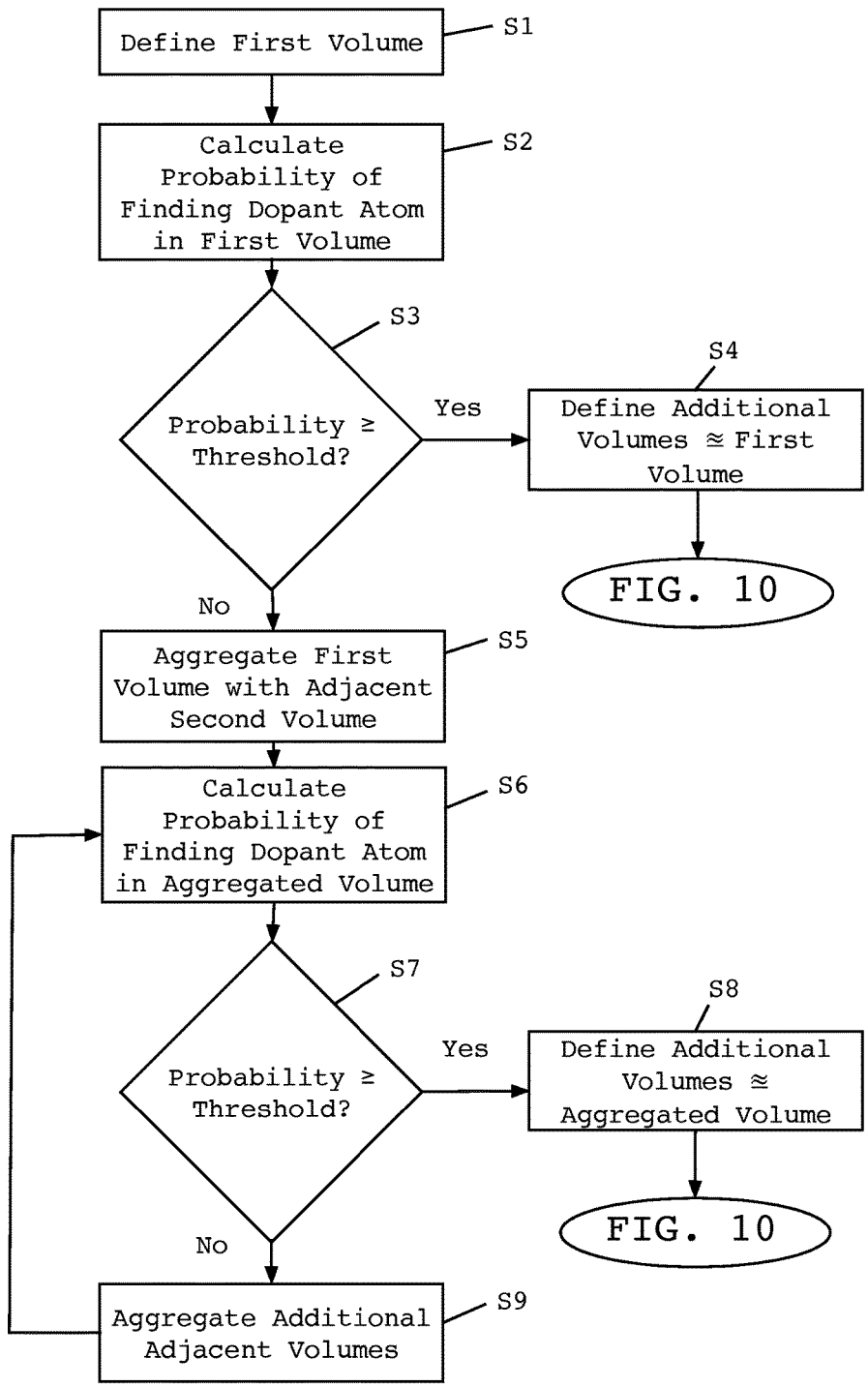
FIGS. 9-10 show flow diagrams of a method according to an embodiment of the invention.
Figure 10:
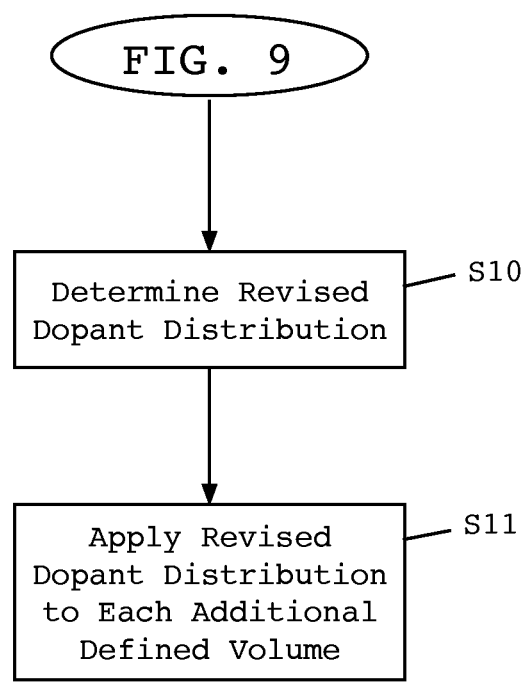

FIGS. 9 and 10 show flow diagrams of an illustrative method according to the invention. At S1, a first volume (e.g., the volume of node 30) is defined. A probability of finding at least one dopant atom within the first volume is calculated at S2.

At S3, it is determined whether the probability calculated at S2 is equal to or greater than a pre-determined threshold. If so (i.e., Yes at S3), additional volumes substantially equal to the first volume may be defined within the layer at S4. If not (i.e., No at S3), the first volume is aggregated with an adjacent second volume at S5, the second volume being substantially equal to the first volume. A probability of finding a dopant atom within the aggregated volume is then calculated at S6.

At S7, it is determined whether the calculated probability at S6 is equal to or greater than the pre-determined threshold. If so (i.e., Yes at S7), additional volumes substantially equal to the aggregated volume may be defined within the layer at S8. If not (i.e., No at S7), the aggregated volume may be reaggregated with an additional adjacent volume at S9 and steps S6, S7, and S9 iteratively looped until the calculated probability is equal to or greater than the predetermined threshold (i.e., Yes at S7).

Once additional volumes are defined within the semiconductor layer (at S4 or S8), a revised dopant distribution is determined at S10 using a Poisson distribution. At S11, the revised dopant distribution determined at S10 is applied to each of the additional volumes defined at S4 or S8.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contains or stores a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in FIGS. 9-10 illustrate the architecture, functionality, and operation of possible implementations of systems, methods, and computer program products according to various embodiments of the present invention. In this regard, each block in the flowchart may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block and combinations of blocks can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of modeling random dopant fluctuations (RDF) in a semiconductor device, the method comprising:
    executing a computer program product stored on a non-transitory machine-readable storage medium, which, once executed, performs the following steps:
    overlaying a finite element mesh atop a model of a layer of a semiconductor device;
    defining a first volume in the layer of the semiconductor device as a node of the finite element mesh;
    calculating a probability of finding at least one dopant atom in the first volume, based on a dopant distribution of the layer;
    in the case that the calculated probability is equal to or greater than a pre-determined threshold, defining at least one additional volume in the layer substantially equal to the first volume; and
    in the case that the calculated probability is less than the pre-determined threshold:
        aggregating the first volume with a second volume adjacent the first volume, the second volume being substantially equal to the first volume; and
        recalculating a probability of finding at least one dopant atom in the aggregated first and second volumes, based on the dopant distribution of the layer,
    wherein the machine-readable storage medium includes at least one medium selected from a group consisting of: an electrical connection having one or more wires, a portable computer diskette, a hard disk, a random access memory, a read-only memory, an erasable programmable read-only memory, an optical fiber, a portable compact disc read-only memory, an optical storage device, and a magnetic storage device; and
    employing the calculated probability to control a dopant distribution fluctuation in a manufactured semiconductor device.

2. The method of claim 1, further comprising:
    in the case that the recalculated probability is equal to or greater than the pre-determined threshold, defining at least one additional volume in the layer substantially equal to the aggregated first and second volumes.

3. The method of claim 2, further comprising:
    determining a revised dopant distribution for the layer based on the recalculated probability using a Poisson distribution; and
    applying the revised dopant distribution to each of the first and second volumes.

4. The method of claim 1, further comprising:
    in the case that the recalculated probability is less than the pre-determined threshold:
        reaggregating an additional volume with the previously aggregated volumes, the additional volume being adjacent to at least one of the volumes making up the previously aggregated volumes; and
        further recalculating a probability of finding at least one dopant atom in the aggregated additional volume and the previously aggregated volumes based on the dopant distribution of the layer.

5. The method of claim 4, wherein the additional volume is substantially equal to at least one of the already aggregated volumes.

6. The method of claim 4, further comprising:
    in the case that the further recalculated probability is less than the pre-determined threshold:
        iteratively looping the reaggregating and further recalculating steps until the further recalculated probability is equal to or greater than the pre-determined threshold; and
        defining at least one additional volume in the layer substantially equal to the reaggregated volumes.

7. The method of claim 6, further comprising:
    determining a revised dopant distribution for the layer based on the further recalculated probability using a Poisson distribution; and
    applying the revised dopant distribution to each volume making up the reaggregated volumes.

8. The method of claim 1, wherein the node is expected to have a lowest dopant concentration of the layer, based on the dopant distribution.

9. The method of claim 8, wherein the second volume has a dopant concentration greater than or equal to the dopant concentration of the first volume.

10. The method of claim 7, wherein applying the revised dopant distribution includes recalculating a probability of finding at least one dopant atom in the first volume, based on the revised dopant distribution.

11. A computer program product for modeling random dopant fluctuations (RDF) in a semiconductor device, the computer program product comprising a non-transitory machine-readable storage medium having program code embodied therewith, the program code being executable by a processor of a computing device to perform a method comprising:
    overlaying a finite element mesh atop a model of a layer of a semiconductor device;
    defining a first volume in the layer of the semiconductor device as a node of the finite element mesh;
    calculating a probability of finding at least one dopant atom in the first volume, based on a dopant distribution of the layer;
    in the case that the calculated probability is equal to or greater than a pre-determined threshold, defining at least one additional volume in the layer substantially equal to the first volume; and
    in the case that the calculated probability is less than the pre-determined threshold:
        aggregating the first volume with a second volume adjacent the first volume, the second volume being substantially equal to the first volume; and
        recalculating a probability of finding at least one dopant atom in the aggregated first and second volumes, based on the dopant distribution of the layer,
    wherein the machine-readable storage medium includes at least one medium selected from a group consisting of: an electrical connection having one or more wires, a portable computer diskette, a hard disk, a random access memory, a read-only memory, an erasable programmable read-only memory, an optical fiber, a portable compact disc read-only memory, an optical storage device, and a magnetic storage device; and employing the calculated probability to control a dopant distribution fluctuation in a manufactured semiconductor device.

12. The computer program product of claim 11, wherein the method further comprises:
in the case that the recalculated probability is equal to or greater than the pre-determined threshold, defining at least one additional volume in the layer substantially equal to the aggregated first and second volumes.

13. The computer program product of claim 12, wherein the method further comprises:
determining a revised dopant distribution for the layer based on the recalculated probability using a Poisson distribution; and
applying the revised dopant distribution to each of the first and second volumes.

14. The computer program product of claim 11, wherein the method further comprises:
in the case that the recalculated probability is less than the pre-determined threshold:
reaggregating an additional volume with the previously aggregated volumes, the additional volume being adjacent to at least one of the volumes making up the previously aggregated volumes; and
further recalculating a probability of finding at least one dopant atom in the aggregated additional volume and the previously aggregated volumes based on the dopant distribution of the layer.

15. The computer program product of claim 14, wherein the additional volume is substantially equal to at least one of the already aggregated volumes.

16. The computer program product of claim 14, wherein the method further comprises:
in the case that the further recalculated probability is less than the pre-determined threshold:
iteratively looping the reaggregating and further recalculating steps until the further recalculated probability is equal to or greater than the pre-determined threshold; and
defining at least one additional volume in the layer substantially equal to the reaggregated volumes.

17. The computer program product of claim 16, wherein the method further comprises:
determining a revised dopant distribution for the layer based on the further recalculated probability using a Poisson distribution; and
applying the revised dopant distribution to each volume making up the reaggregated volumes.

18. The computer program product of claim 11, wherein the second volume has a dopant concentration greater than or equal to the dopant concentration of the first volume.

* * * * *